(12) United States Patent
Chang (10) Patent No.: US 11,901,842 B2
(45) Date of Patent: Feb. 13, 2024

(54) ENERGY HARVESTING APPARATUS UTILIZING ELECTROACTIVE MATERIAL AND ELECTRODE UNIT FOR DEFORMATION

(71) Applicant: CHUNG-ANG UNIVERSITY INDUSTRY-ACADEMIC COOPERATION FOUNDATION, Seoul (KR)

(72) Inventor: Seung Hwan Chang, Seoul (KR)

(73) Assignee: CHUNG-ANG UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 491 days.

(21) Appl. No.: 17/257,996

(22) PCT Filed: Jul. 10, 2018

(86) PCT No.: PCT/KR2018/007767
§ 371 (c)(1),
(2) Date: Jan. 5, 2021

(87) PCT Pub. No.: WO2020/013350
PCT Pub. Date: Jan. 16, 2020

(65) Prior Publication Data
US 2021/0273588 A1    Sep. 2, 2021

(51) Int. Cl.
*H02N 2/18*     (2006.01)
*H10N 30/30*    (2023.01)
(Continued)

(52) U.S. Cl.
CPC ............. *H02N 2/183* (2013.01); *H10N 30/30* (2023.02); *H10N 30/50* (2023.02); *H10N 30/871* (2023.02)

(58) Field of Classification Search
CPC ........ H02N 2/186; H02N 2/183; H10N 30/50; H10N 30/871; H10N 30/30
See application file for complete search history.

(56) References Cited

U.S. PATENT DOCUMENTS 10,137,306 B2 * 11/2018 Dagdeviren ........... H02N 2/181
2013/0207793 A1 * 8/2013 Weaber ................... G06F 3/041
340/407.2
(Continued)

FOREIGN PATENT DOCUMENTS

KR    10-2013-0063365 A    6/2013
KR    10-2014-0096644 A    8/2014
(Continued)

*Primary Examiner* — J. San Martin
(74) *Attorney, Agent, or Firm* — Bridgeway IP Law Group, PLLC; Sang Ho Lee; Hyun Woo Shin (57) ABSTRACT

An energy harvesting apparatus using an electroactive material includes an electricity generator including the electroactive material to generate a voltage due to deformation caused by an external stimulus, and an impact generator including a deformable and restorable material capable of repetitive deformation and restoration and configured to generate a dynamic behavior based on the repetitive deformation and restoration in the electricity generator. A stimulus of the impact generator with respect to the electricity generator enables energy harvest. An electrode unit for deformation includes an electricity generator including an electroactive material to generate a voltage due to deformation caused by an external stimulus, and an electrode part electrically connected to at least one surface of the electricity generator, and including an elastically deformable material to achieve relative deformation while in contact with the electricity generator.

15 Claims, 11 Drawing Sheets

(51) Int. Cl.
  *H10N 30/50* (2023.01)
  *H10N 30/87* (2023.01)

(56) References Cited

U.S. PATENT DOCUMENTS

| | | | | |
|---|---|---|---|---|
| 2013/0280549 A1* | 10/2013 | Monfray | ................ | B05D 3/107 |
| | | | | 29/25.35 |
| 2016/0156287 A1* | 6/2016 | Yang | .................... | H10N 30/306 |
| | | | | 310/339 |
| 2017/0324022 A1* | 11/2017 | Ting | ....................... | H10N 30/88 |
| 2018/0123484 A1* | 5/2018 | Peace | ....................... | H02N 2/18 |
| 2018/0171514 A1* | 6/2018 | Cobanoglu | ............ | G01K 7/003 |
| 2021/0151662 A1* | 5/2021 | Ting | ................... | G06K 19/0724 |

FOREIGN PATENT DOCUMENTS

| | | |
|---|---|---|
| KR | 10-1653061 B1 | 9/2016 |
| KR | 10-1714368 B1 | 3/2017 |
| KR | 10-2017-0072810 A | 6/2017 |
| KR | 101952507 B1 * | 2/2019 |

\* cited by examiner

FIG. 18

ENERGY HARVESTING APPARATUS UTILIZING ELECTROACTIVE MATERIAL AND ELECTRODE UNIT FOR DEFORMATION

TECHNICAL FIELD

The present disclosure relates to energy harvesting apparatuses using an electroactive material, and more particularly, to an energy harvesting apparatus using an electroactive material having an improved structure, by which a static load or weak impact is converted into a large-scale dynamic load or impact load and thus energy harvesting efficiency is increased.

The present disclosure also relates to electrode units for deformation, and more particularly, to an electrode unit for deformation having an improved structure, which may suppress damage to or destruction of an electrode provided on a substrate (including an electroactive material) for energy harvesting due to repetitive deformation of the substrate.

BACKGROUND ART

In recent years, sensors or energy harvesters using an electroactive material have been actively studied. The electroactive material refers to a material capable of deforming when electricity is conducted or conversely generating electricity due to deformation, and is commercially available in the field of sensors and energy harvesting.

An example of a sensor using this electroactive material is disclosed in Korean Patent No. 10-1653061. As such, sensors or energy harvesters using an electroactive material are being utilized in various industrial fields.

However, these sensors or energy harvesters using an electroactive material mainly achieve static behaviors causing small deformation, instead of dynamic behaviors, due to external forces, and thus cannot perform precise sensing of deformation information or efficient energy harvesting.

PRIOR ART DOCUMENTS (Patent Document 1) KR 10-1653061

In recent years, sensors or energy harvesters using an electroactive material have been actively studied. The electroactive material refers to a material capable of deforming when electricity is conducted or conversely generating electricity due to deformation, and is commercially available in the field of sensors and energy harvesting.

An example of a sensor using this electroactive material is disclosed in Korean Patent No. 10-1653061. As such, sensors or energy harvesters using an electroactive material are being utilized in various industrial fields.

Figure 11:
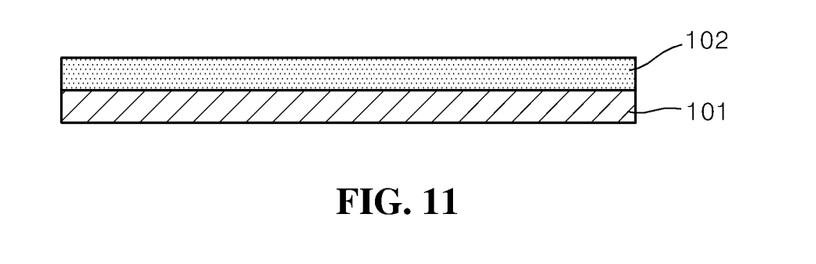
FIG. 11 is a cross-sectional view illustrating a structure of a conventional electrode unit.
Figure 12:
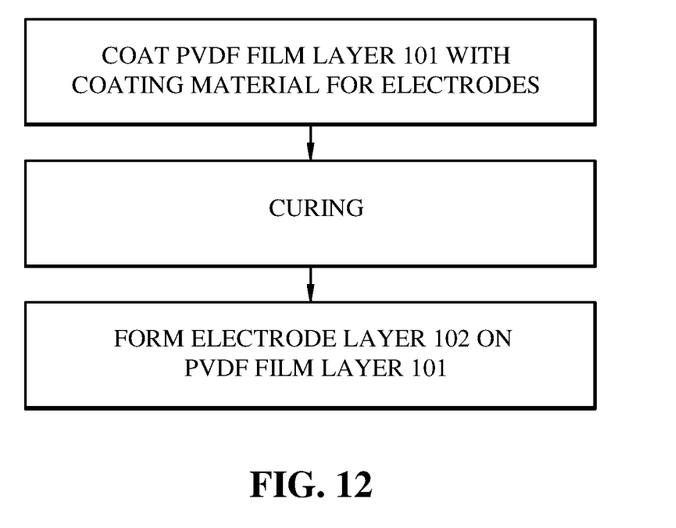
FIG. 12 is a block diagram for explaining a coupling process of a conventional electrode unit.

However, in these sensors or energy harvesters using an electroactive material, as shown in FIGS. 11 and 12, a polyvinylidene difluoride (PVDF) film layer 101 for generating electric energy and an electrode layer 102 enabling electricity generated by the PVDF film layer 101 to be harvested are coated and then coupled to each other via curing, and thus a repetitive deforming force of the PVDF film layer 101 is applied to the electrode layer 102, causing damage to or destruction of the electrode layer 102.

DESCRIPTION OF EMBODIMENTS

Technical Problem

Provided is an energy harvesting apparatus using an electroactive material capable of increasing energy harvesting efficiency by enabling induction of a large dynamic load or impact load even with a week static load and enabling repetitive deformation and restoration.

Provided is an electrode unit for deformation that enables smooth relative deformation even while a contact between an electricity generator and an electrode part is maintained.

Solution to Problem

According to an aspect of the present disclosure, an energy harvesting apparatus using an electroactive material includes an electricity generator including the electroactive material to generate a voltage due to deformation caused by an external stimulus, and an impact generator including a deformable and restorable material capable of repetitive deformation and restoration and configured to generate in the electricity generator a dynamic behavior based on the repetitive deformation and restoration. A stimulus by the impact generator to the electricity generator enables energy harvest.

According to an aspect of the present disclosure, an electrode unit for deformation includes an electricity generator including an electroactive material to generate a voltage due to deformation caused by an external stimulus, and an electrode part electrically connected to at least one surface of the electricity generator, and including an elastically deformable material to achieve relative deformation while in contact with the electricity generator.

Advantageous Effects of Disclosure

An energy harvesting apparatus using an electroactive material according to the present disclosure having a structure as described above is configured such that an impact generator including a material that may be repeatedly deformed and restored applies a repetitive dynamic load to an electricity generator enabling electric energy to be generated due to deformation, and thus a dynamic load or impact load that causes repetitive and large deformation may be induced even due to a static load applied to the impact generator, leading to an increase in energy harvesting efficiency.

An electrode unit for deformation according to the present disclosure having a configuration as described above is configured so that, even when repetitive large deformation occurs by an electricity generator, an electrode part may achieve relative deformation while in contact with the electricity generator, and thus the electrode unit for deformation is able to suppress a deforming force (shear force) by the electricity generator from being continuously applied to the electrode part as in the convention art. Therefore, durability improvement of the electrode part and a large deformation design of the electricity generator are both enabled, leading to an increase in energy harvest or sensing efficiency.

BEST MODE

An energy harvesting apparatus according to an embodiment of the present disclosure will now be described in detail with reference to the accompanying drawings.

Figure 1:
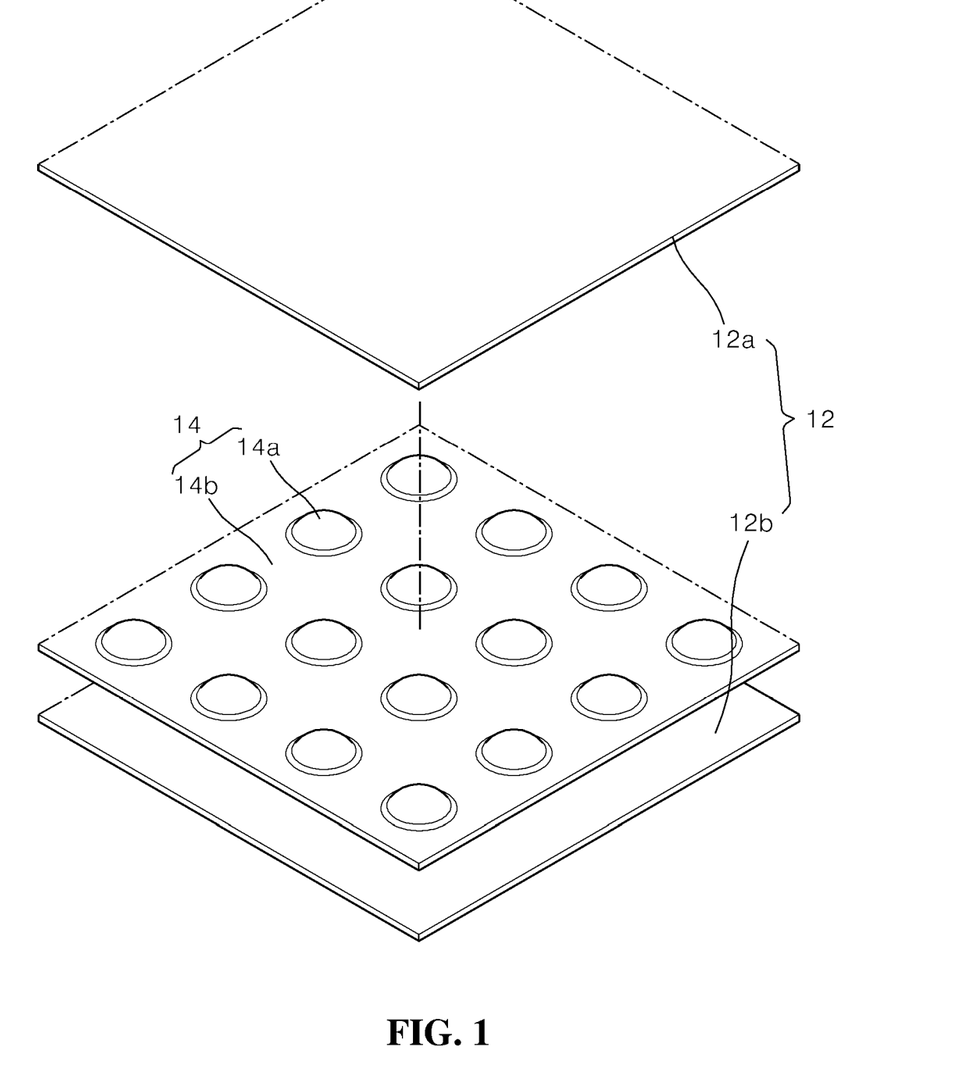
FIG. 1 is an exploded perspective view of an energy harvesting apparatus using an electroactive material, according to an embodiment of the present disclosure.
Figure 2:
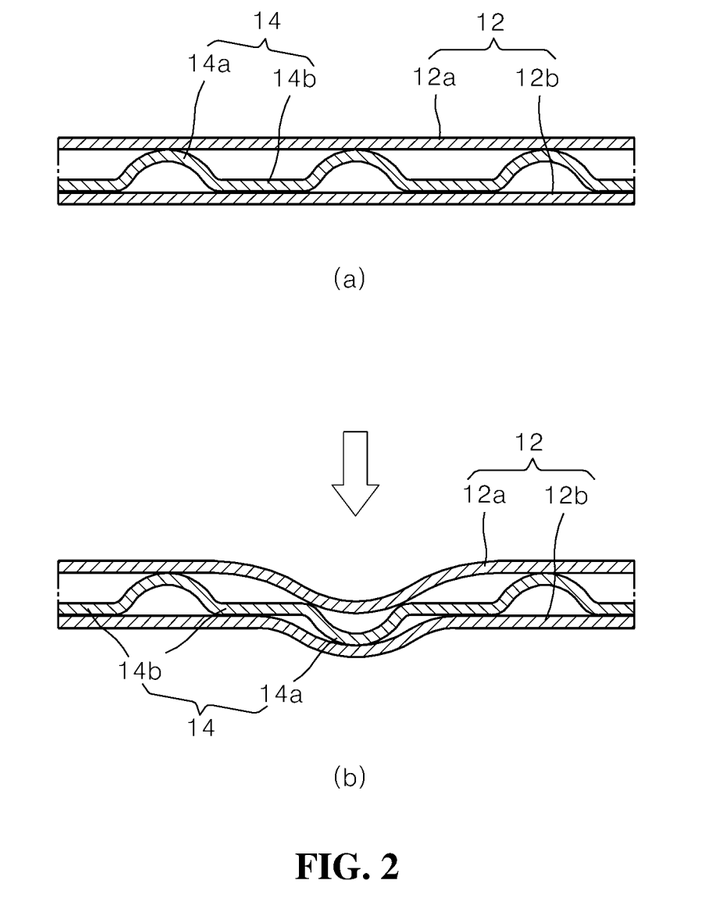
FIG. 2 is a cross-sectional view illustrating a structure and an operational state of an embodiment of the present disclosure.

FIG. 1 is an exploded perspective view of an energy harvesting apparatus using an electroactive material, according to an embodiment of the present disclosure, and FIG. 2 is a cross-sectional view illustrating a structure and an operational state of an embodiment of the present disclosure.

As shown in FIGS. 1 and 2, the energy harvesting apparatus using an electroactive material according to an embodiment of the present disclosure increases energy harvesting efficiency by using the electroactive material and a deformable and restorable material, and includes an electricity generator 12 formed of a material including the electroactive material and an impact generator 14 formed of a material including a material that may be repeatedly deformed and restored.

The electricity generator 12 may be configured as, for example, a film including an electroactive polymer material that operates according to the ferroelectric behavior principle, and may be manufactured in the form of a weaving of fibers including electrodes formed of the same material or a weaving of a ribbon including electrodes on both sides thereof.

The electroactive polymer material used to form the electricity generator 12 has a fast mechanical/electrical coupling reaction speed, high reliability and stability for mechanical/electrical behaviors, and good characteristics to be used as a sensor for sensing deformation, such as low impedance, and may be, but is not limited to, polyvinylidene difluoride (PVDF) that operates according to the ferroelectric behavior principle.

Although not shown in the drawings, the electricity generator 12 may include an electrode for transmitting generated electric energy to the outside, and a capacitor for temporarily storing energy harvested through the electrode.

The impact generator 14 may be formed of various materials that may be repeatedly deformed and restored, but may be formed of a deformable and restorable material such as a shape memory material and generates repetitive dynamic behaviors in the electricity generator 12.

In other words, because the impact generator 14 is not only deformed but also is restored back to the original location because of its material properties, the impact generator 14 enables repetitive deformation and thus enables continuous energy harvesting.

In the energy harvesting apparatus using an electroactive material according to an embodiment of the present disclosure having a structure as described above, the impact generator 14 including a material that may be repeatedly deformed and restored is configured to apply a repetitive dynamic load to the electricity generator 12 enabling electric energy to be generated due to deformation, and thus a dynamic load or impact load that causes repetitive and large deformation may be induced even due to a static load applied to the impact generator 14, leading to an increase in energy harvesting efficiency.

Examples of the deformable and restorable material employed in the impact generator 14 may include a spring and a snap dome, but, may be, for example, a shape memory material that is a general term for an alloy or polymer that memorizes the original shape even when being deformed due to an applied force and is thus immediately restored to the original shape.

The shape memory material includes a shape memory alloy such as a nickel-titanium alloy or a copper-zinc-aluminum alloy, and a shape memory polymer (SMP) that is restored to the original shape under certain conditions even when being deformed due to an external impact.

The impact generator 14 employed in the present embodiment includes a plurality of deformation parts 14a arranged vertically and horizontally at regular intervals and formed of a deformable and restorable material such as a shape memory material. The present embodiment having this configuration enables multi-point stimulus delivery through contact points between the deformation parts 14a and the electricity generator 12, thereby more increasing energy harvesting efficiency.

The impact generator 14 employed in the present embodiment is formed of a deformable and restorable material such as spring, and is thus sufficient to have a structure including the plurality of deformation parts 14a that are restored back to the original shape after being deformed. However, the impact generator 14 may have a snap dome structure including a portion that is turned over when a threshold load or greater is applied, so that a relatively large dynamic load is applied to the electricity generator 12.

The impact generator 14 having this snap dome structure includes the plurality of deformation parts 14a that are turned over when a threshold load or greater is applied and are arranged at regular intervals, and a plurality of connection parts 14b connecting the deformation parts 14a to each other.

In the present embodiment having this configuration, a snap dome structure that is instantaneously turned over when a threshold load or greater is applied is employed in the impact generator 14 to simultaneously apply an instantaneous dynamic load to a plurality of points of the electricity generator 12, and thus electric energy may be more efficiently harvested.

The electricity generator 12 employed in the present embodiment includes a first film layer 12a and a second film layer 12b located opposite to each other with the impact generator 14 therebetween.

Each of the first film layer 12a and the second film layer 12b includes an electroactive material and is used after being manufactured in the form of a thin film and then cut to have a desired size as necessary.

The first film layer 12a and the second film layer 12b are sufficient to be arranged to selectively contact the deformation parts 14a of the impact generator 14. However, according to another embodiment of the present disclosure, the first film layer 12a and the second film layer 12b may be formed in a pocket structure to be able to accommodate the impact generator 14.

As in the present embodiment, according to a structure in which the first film layer 12a and the second film layer 12b are located opposite to each other with the impact generator 14 interposed therebetween, when the deformation parts 14a of the impact generator 14 are deformed as shown in (a) of FIG. 2, electric energy may be generated by the first film layer 12a, and, when the deformation parts 14a are deformed as shown in (b) of FIG. 2, the first film layer 12a and the second film layer 12b may simultaneously generate electric energy.

Although not shown in the drawings, when the electricity generator 12 includes the first film layer 12a, the second film layer 12b, and a connection layer that connects the first and second film layers to each other and thus has a pocket structure in which the impact generator 14 is accommodated, the electricity generator 12 and the impact generator 14 may be relatively smoothly coupled with each other.

According to the present embodiment, the first film layer 12a and the second film layer 12b are arranged to selectively contact the impact generator 14 after being manufactured in a film form separately from the impact generator 14. However, according to another embodiment of the present disclosure, the first film layer 12a and the second film layer 12b may be formed on the impact generator 14 according to a coating method.

Figure 3:
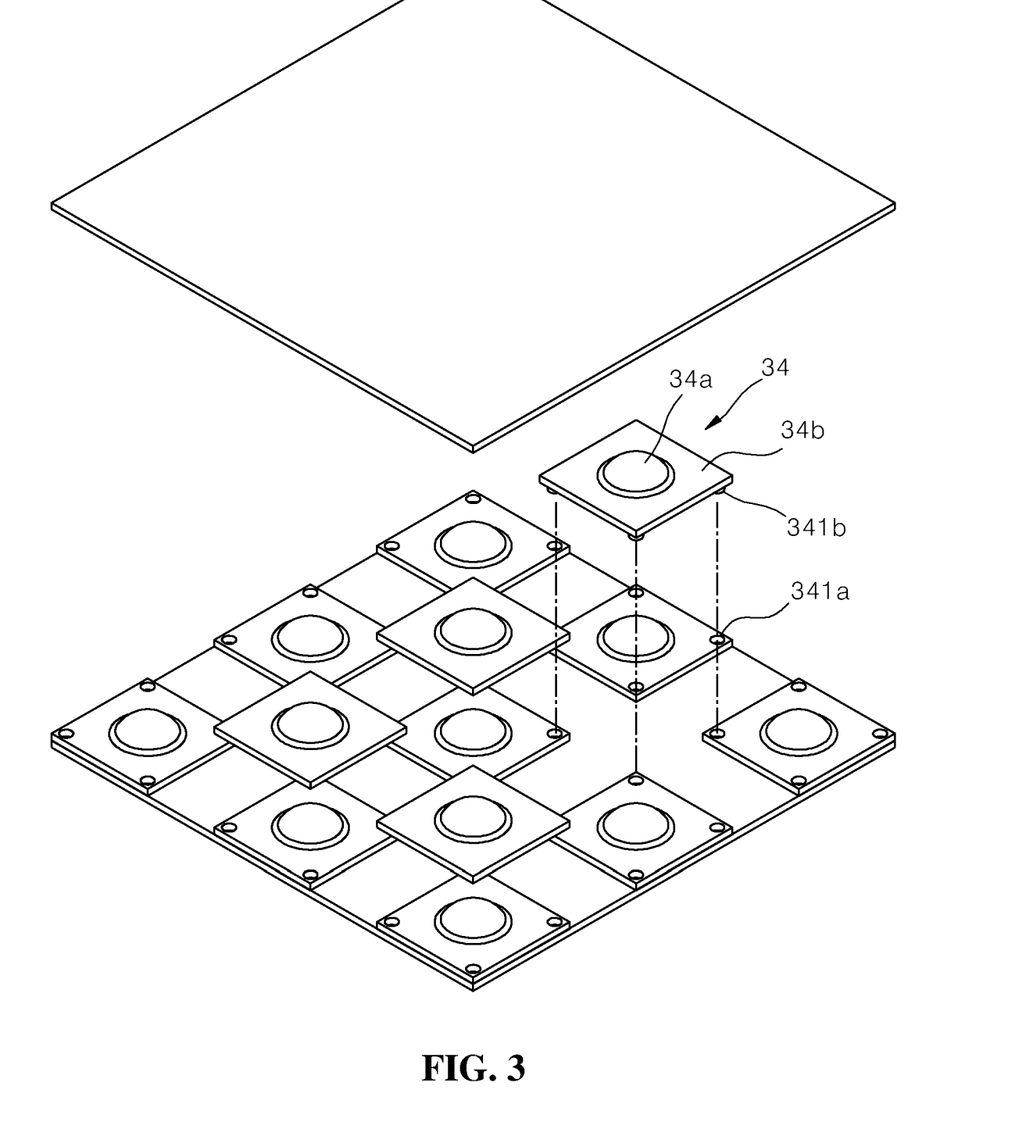
FIG. 3 is an exploded perspective view of another embodiment of the present disclosure.
Figure 4:
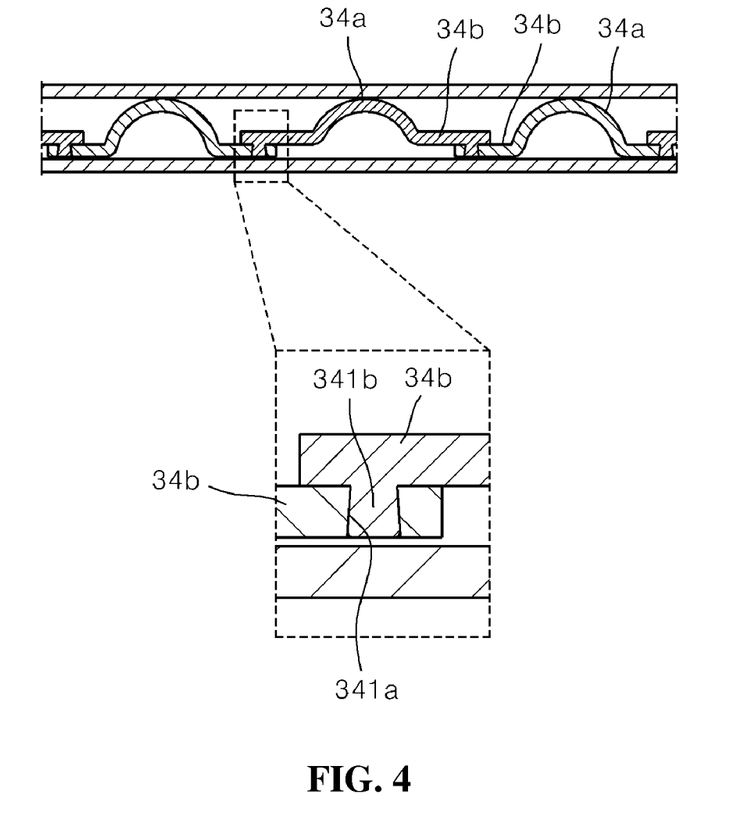
FIG. 4 is a cross-sectional view of another embodiment of the present disclosure.

FIG. 3 is an exploded perspective view of another embodiment of the present disclosure, and FIG. 4 is a cross-sectional view of another embodiment of the present disclosure.

As shown in FIGS. 3 and 4, an impact generator 34 employed in the present embodiment includes a plurality of unit impact units that may form a required size due to coupling after being separately manufactured, and each of the plurality of unit impact units includes a deformation part 34a that is turned over when a threshold load or more is applied, and a connection part 34b that connects adjacent deformation parts 34a to each other.

The present embodiment includes locking holes 341a formed in one of a pair of connection parts 34b adjacent to each other, and locking pins 341b formed in the other, so that connection between the unit impact units is smoothly achieved through locking between the locking holes 341a and the locking pins 341b.

In the present embodiment having this configuration, the impact generator 34 may be easily manufactured to have a required area by connecting the unit impact units having a snap dome structure to one another, and thus improvement in the mass productivity of products may be anticipated.

According to the present embodiment, the impact generator is realized by vertically and horizontally arranging unit impact units in units of surfaces. However, an impact generator employed in another embodiment of the disclosure may be realized by forming a plurality of deformation parts arranged in a lengthwise direction of unit impact unit each having a long and narrow beam shape, in the unit impact units, and intersecting the unit impact units in the beam shape with one another.

Figure 5:
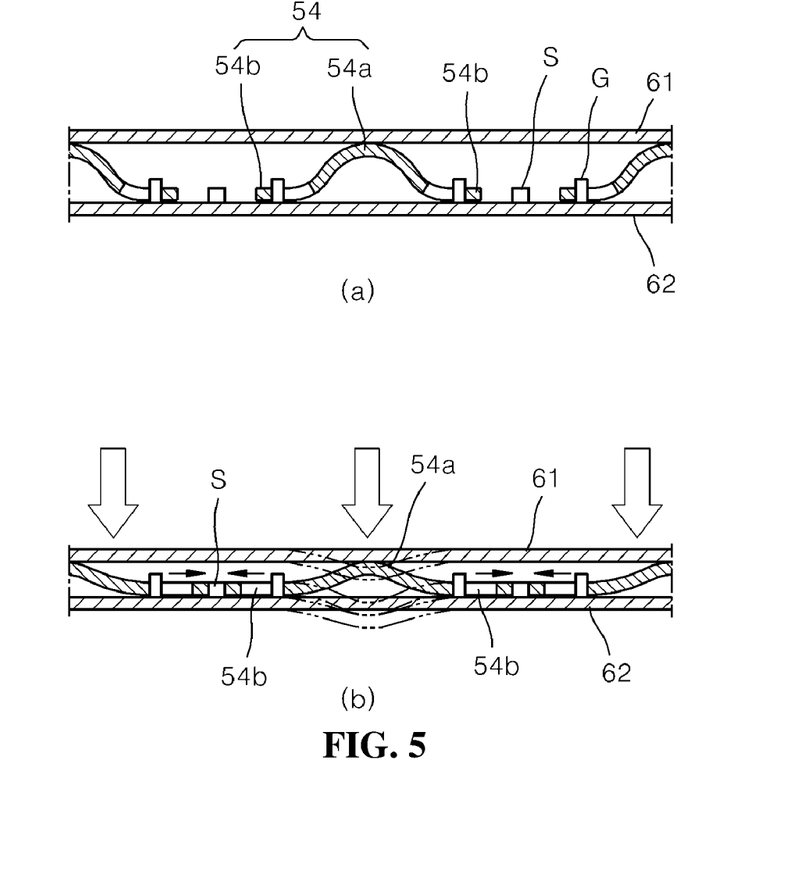
FIG. 5 is a cross-sectional view of another embodiment of the present disclosure.

FIG. 5 is a cross-sectional view of another embodiment of the present disclosure.

An impact generator employed in the present embodiment includes unit impact units 54 arranged to correspond to the entire area of the electricity generator so that a multi-point stimulus is enabled in the electricity generator.

Each of the unit impact units 54 includes a deformation part 54a formed of a deformable and restorable material, and a sliding part 54b integrally formed with the deformation part 54a and sliding according to deformation of the deformation part 54a. Repetitive deformation and restoration occurs in the deformation part 54a, and the sliding part 54b causes friction with a second film layer 62 by sliding along the deformation of the deformation part 54a. The deformation part 54a may be formed of a shape memory material.

In the present embodiment having this configuration, the deformation part 54a of the unit impact unit 54 is configured to apply a continuous stimulus to a first film layer 61 and the second film layer 62 each including an electroactive polymer material, thereby enabling electric energy harvest, and the sliding part 54b causes frictional charge with the second film layer 62, thereby enabling additional energy harvest due to the frictional charge.

In FIG. 5, reference character G indicates a guide member that guides movement of the sliding part 54b, and reference character S indicates a stopper that restricts a movement range of the sliding part 54b.

Figure 6:
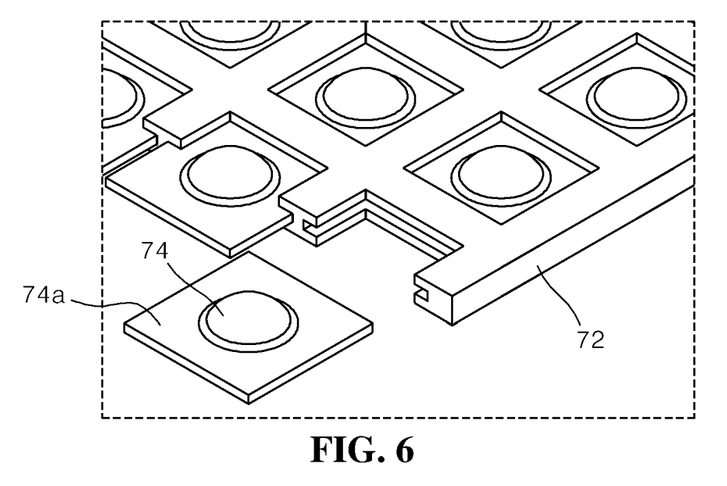
FIG. 6 is a plan view of another embodiment of the present disclosure.
Figure 7:
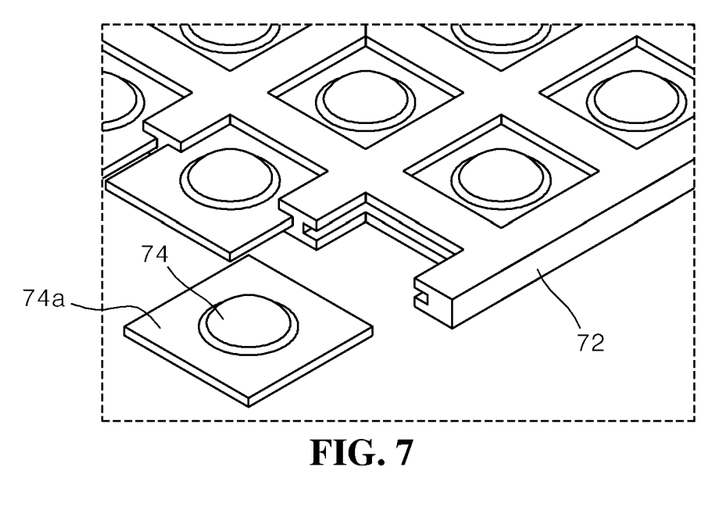
FIG. 7 is a partial cut-away perspective view of an enlargement of portion A of FIG. 6.

FIG. 6 is a plan view of another embodiment of the present disclosure, and FIG. 7 is a partial cut-away perspective view of an enlargement of portion A of FIG. 6.

An impact generator employed in the present embodiment includes a frame part 72 having a lattice-shaped frame structure to form a plurality of spaces, and a deformation part 74 located in each of the spaces of the frame part 72 and formed of a deformable and restorable material. The deformation part 54a may be formed of a shape memory material.

A groove-shaped slot onto which an edge of the deformation part 74 fits is formed on a surface that defines each space of the frame part 72.

In the present embodiment having this configuration, a plurality of deformation parts 74 generating a dynamic load in an electricity generator C (structure that accommodates the frame part therein) fit into the slots of the frame part 72, respectively, and consequently a structure of the impact generator may be smoothly realized according to required design specifications, leading to an improvement in mass productivity of products.

Figure 8:
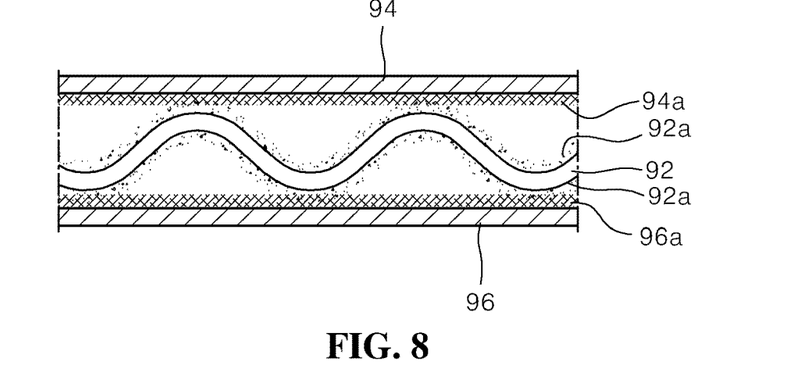
FIG. 8 is a cross-sectional view of another embodiment of the present disclosure.

FIG. 8 is a cross-sectional view of another embodiment of the present disclosure.

The present embodiment includes an impact generator 92 formed of a repeatedly deformable and restorable material such as a shape memory material, and a first generator 94 and a second generator 96 both capable of generating electric energy due to deformation caused by a dynamic load applied by the impact generator 92.

The first generator 94 and the second generator 96 includes an electroactive material to generate a voltage due to deformation by an external stimulus, and preferably includes a shape memory material to enable repetitive deformation and restoration.

The impact generator 92 is to apply a stimulus for deforming the first and second generators 94 and 96, and is located between the first and second generators 94 and 96 to be able to simultaneously apply stimuli to the first and second generators 94 and 96, thereby more improving energy harvesting efficiency.

The impact generator 92 may have a snap dome structure, similar to the above-described embodiments. However, according to the present embodiment, the impact generator 92 has a structure including a plurality of uneven parts where spreading in a flat form and bending in a curved form may occur.

According to the present embodiment, Velcro® parts 92a, 94a, and 96a are provided on facing surfaces between the impact generator 92 and the first generator 94 and facing surfaces between the impact generator 92 and the second generator 96.

In the present embodiment having this configuration, while the Velcro® parts 92a, 94a, and 96a facing each other are being coupled to each other and then separated from each other, gradual deformation is achieved with a time difference from deformation to restoration of the first and second generators 94 and 96, and thus energy may be more continuously harvested due to the gradual deformation of the first and second generators 94 and 96.

According to the present embodiment, the impact generator and the first and second generators are each configured to separately perform dynamic behavior induction and electric energy generation, which are original functions, but embodiments of the present disclosure are not limited thereto. For example, the impact generator may be realized to perform an energy harvesting function by including an electroactive material, or the first and second generators may be realized to perform dynamic behavior induction by including a material where shape deformation and restoration may occur, and the first and second electricity generators and the impact generator may independently have the structure of FIG. 1.

Figure 9:
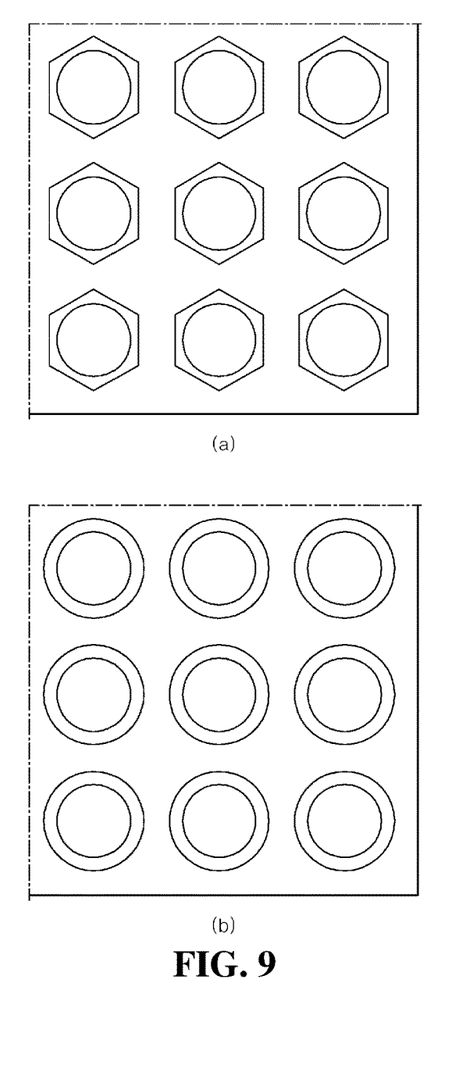
FIG. 9 is a plan view showing various structures of an impact generator employed in another embodiment of the present disclosure.

FIG. 9 is a plan view showing various structures of an impact generator employed in another embodiment of the present disclosure.

As shown in FIG. 9, the impact generator employed in the present embodiment may be realized in a membrane form in which the shape of the deformation part is a hexagonal structure as in (a) of FIG. 9 or a circular structure as in (b) of FIG. 9, but embodiments of the present disclosure are not limited thereto. For example, the impact generator may be realized in a structure having any other polygonal shape or in a strip form instead of a membrane form.

Figure 10:
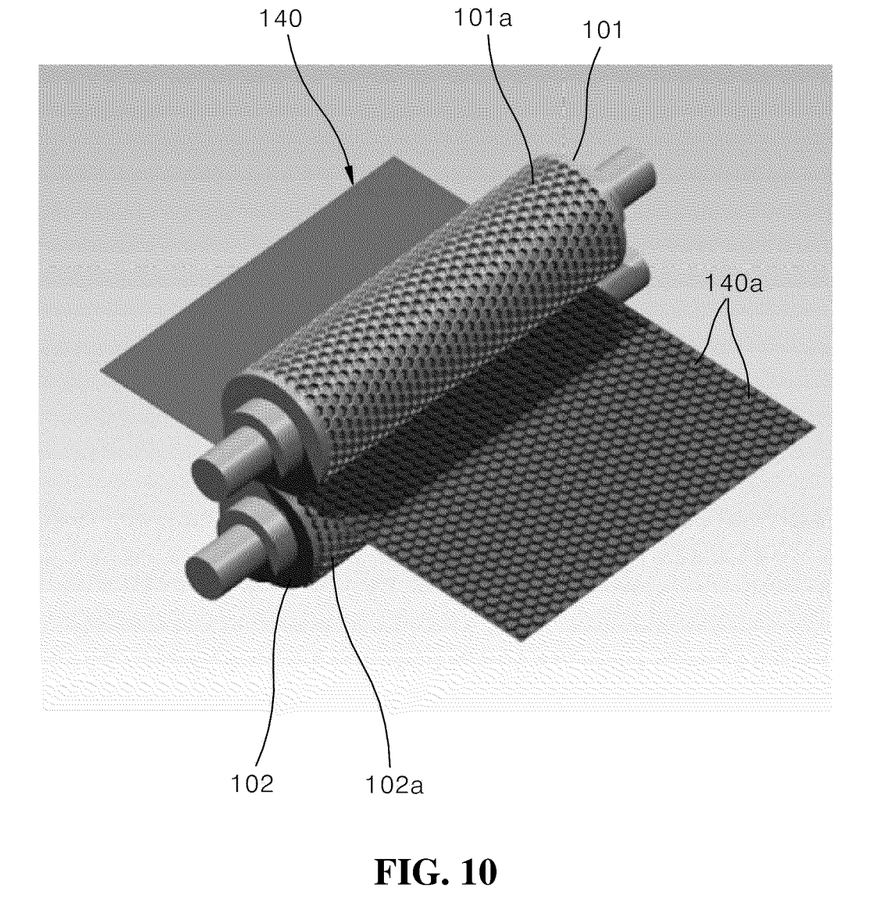
FIG. 10 is a view for explaining a structure and a molding method of an impact generator employed in another embodiment of the present disclosure.

FIG. 10 is a view for explaining a structure and a molding method of an impact generator employed in another embodiment of the present disclosure.

The impact generator employed in the present embodiment may be realized by passing a metal thin plate 140 between a plurality of molding rollers 101 and 102 and thus forming deformation parts 140a having a shape corresponding to the external surface of the molding rollers 101 and 102 on the metal thin plate 140. In other words, when one of the pair of molding rollers, namely, the molding roller 101, has grooves 101a formed therein and the other thereof, namely, the molding roller 102, has protrusions 102a formed therein, the protrusions 102a corresponding to the grooves 101a, and the metal thin plate 140 is passed between the pair of molding rollers 101 and 102, a plurality of deformation parts 140a may be formed on the metal thin plate 140.

An electrode unit for deformation according to an embodiment of the present disclosure will now be described in detail with reference to the accompanying drawings.

Figure 13:
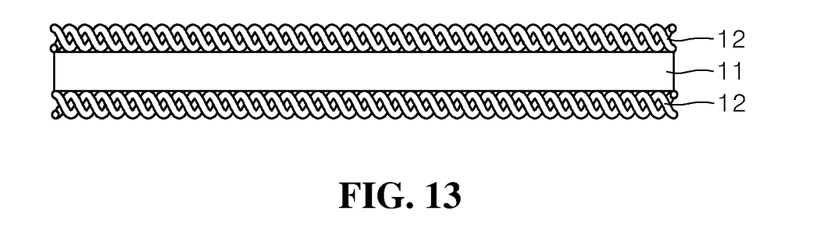
FIG. 13 is a cross-sectional view of an electrode unit for deformation according to an embodiment of the present disclosure.
Figure 14:
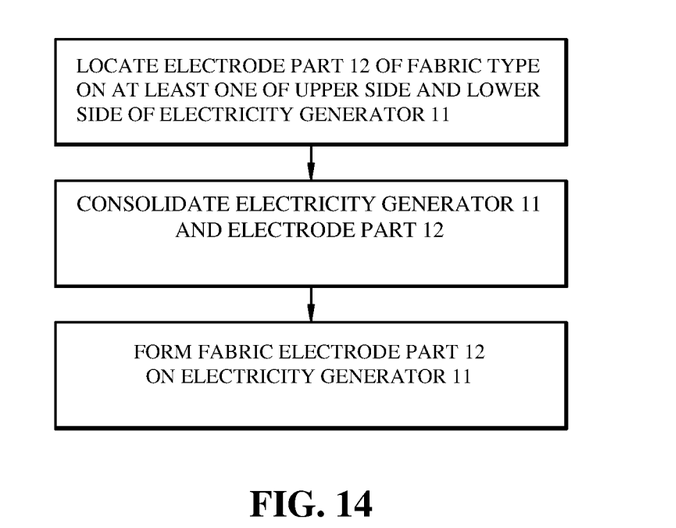
FIG. 14 is a block diagram for explaining a coupling process between the components constituting an embodiment of the present disclosure.

FIG. 13 is a cross-sectional view of the electrode unit for deformation according to an embodiment of the present disclosure, and FIG. 14 is a block diagram for explaining a coupling process between the components constituting an embodiment of the present disclosure.

As shown in FIGS. 13 and 14, the electrode unit for deformation according to an embodiment of the present disclosure harvests energy by using an electroactive material or performs a function as a sensor, and includes an electricity generator 11 and an electrode part 12.

The electricity generator 11 enables electric energy generation by generating a voltage during deformation due to an external stimulus by including an electroactive material, and the electrode part 12 enables collection of electricity generated by the electricity generator 11.

The electricity generator 11 may be formed as a film including an electroactive polymer material that operates according to the ferroelectric behavior principle, and may be manufactured in the form of a weaving of fibers including the material or a ribbon weaving.

The electroactive polymer material used to form the electricity generator 11 has a fast mechanical/electrical coupling reaction speed, high reliability and stability for mechanical/electrical behaviors, and good characteristics to be used as a sensor for sensing deformation, such as low impedance, and may be, but is not limited to, PVDF that operates according to the ferroelectric behavior principle.

Although not shown in the drawings, the present embodiment may include a capacitor for temporarily storing energy harvested through the electrode part 12.

The electrode part 12 is formed of a material electrically connectable to the electricity generator 11, is electrically connected to at least one surface of the electricity generator 11 according to a method such as non-chemical bonding such as consolidation, and is formed of a material that may be restored to the original shape after being deformed, so that relative deformation may be achieved even while in contact with the electricity generator 11.

The electrode unit for deformation according to an embodiment of the present disclosure having a configuration as described above is configured so that, even when repetitive large deformation occurs by the electricity generator 11, the electrode part 12 may achieve relative deformation while in contact with the electricity generator 11. Thus, the electrode unit for deformation is able to suppress a deforming force (shear force) by the electricity generator 11 from being continuously applied to the electrode part 12 as in the convention art, and thus durability improvement of the electrode part 12 and a large deformation design of the electricity generator 11 are both enabled, leading to an increase in energy harvest or sensing efficiency.

The electrode part 12 employed in the present embodiment is sufficient to be formed of an elastically deformable material so as to be restored to the original shape after being deformed, but is preferably formed of a fabric material such as a conductive fiber material to achieve deformability improvement. The fabric refers to overall materials of textile products such as woven, knitted, and nonwoven fabrics.

Figure 15:
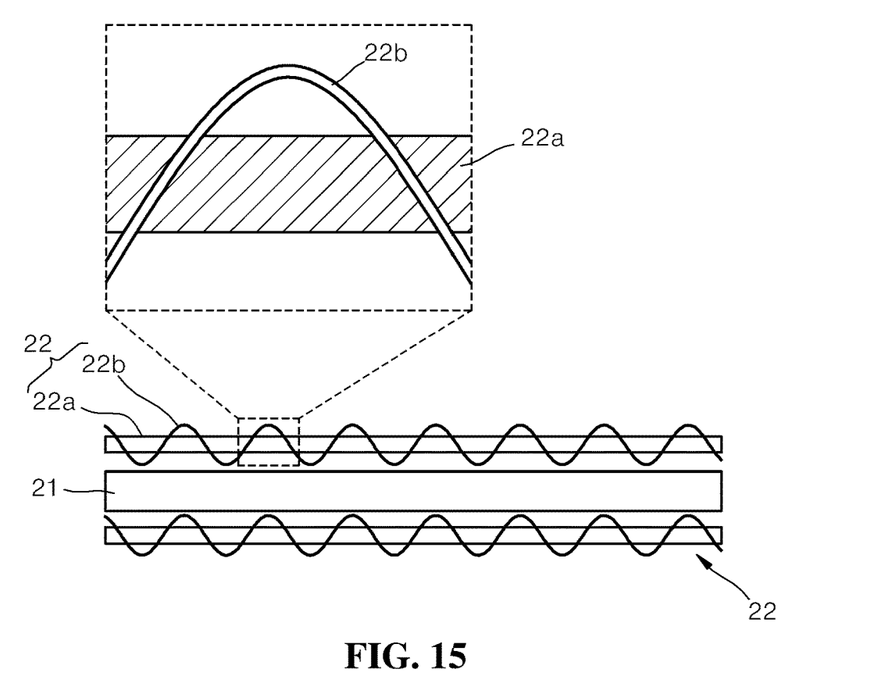
FIG. 15 is a cross-sectional view of an electrode unit for deformation according to another embodiment of the present disclosure.

FIG. 15 is a cross-sectional view of an electrode unit for deformation according to another embodiment of the present disclosure.

An electrode part 22 employed in the present embodiment includes a base layer 22a and a stitching electrode layer 22b such that deformation and electrical connection are separately achieved, in contrast with the electrode part 12 of FIG. 13 being configured such that an electrical connection part performing electrical connection and a deformation part causing deformation may simultaneously perform deformation and electrical connection by using the same conductive fabric material, without being separated from each other.

In other words, the electrode part 22 includes the base layer 22a causing deformation together with the electricity generator 21, and the stitching electrode layer 22b electrically connected to the electricity generator 21.

The base layer 22a is formed of an elastically deformable material to be deformed together with the electricity generator 21 while the electricity generator 21 is being deformed, and the stitching electrode layer 22b is provided on the base layer 22a by sequentially penetrating a fiber thread of an electrically connectable material through a surface opposite to the base layer 22a and a surface on the opposite side with a time interval according to a similar method to sewing.

In the present embodiment having this configuration, because the base layer 22a included in the electrode part 22 is configured to be deformed together with the electricity generator 21, a shear force due to deformation of the electricity generator 21 may be suppressed from being applied to the base layer 22a, and, because the stitching electrode layer 22b provided on the base layer 22a according to a sewing method is configured to keep contact with the electricity generator 21, smooth electric energy harvesting is possible.

The base layer 22a is sufficient to be formed of an elastically deformable material, but may be formed of a PVDF material like the electricity generator 21, and, because the base layer 22a is relatively deformable while in contact with the electricity generator 21, the base layer 22a may be formed of a material enabling energy harvest due to frictional charge with the electricity generator 21.

Figure 16:
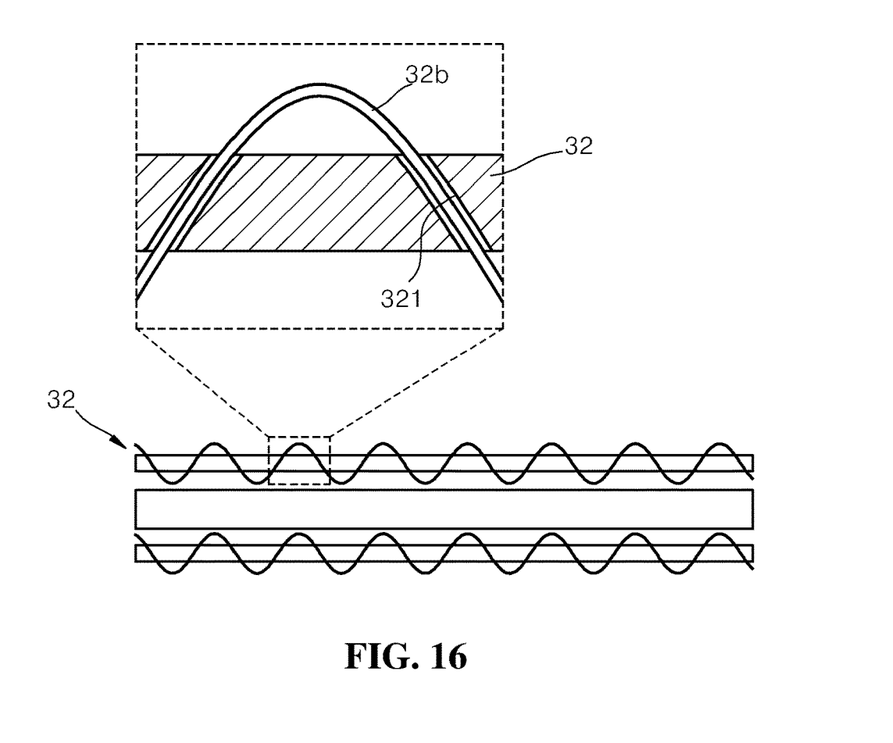
FIG. 16 is a cross-sectional view of an electrode unit for deformation according to another embodiment of the present disclosure.

FIG. 16 is a cross-sectional view of an electrode unit for deformation according to another embodiment of the present disclosure.

An electrode part 32 employed in the present embodiment has the same basic configuration as the embodiment of FIG. 15, but is different from the embodiment of FIG. 15 in terms of the size of a through hole 321 formed in a base layer 32a and a method of forming a stitching electrode layer 32b.

In other words, the base layer 32a employed in the present embodiment includes a plurality of through holes 321 through which the stitching electrode layer 32b of a fiber thread type loosely penetrates.

In the present embodiment having this configuration, each through hole 321 having a size enabling the stitching electrode layer 32b and the base layer 32a to be more freely deformed is formed between the stitching electrode layer 32b and the base layer 32a, and thus deformation of the base layer 32a may be minimized from being disturbed by the stitching electrode layer 32b.

The through hole 321 may be realized according to various methods, but, for example, may be formed by allowing a fiber thread having a relatively large diameter to pass through the base layer 32a before the stitching electrode layer 32b having a relatively small diameter passes through the base layer 32a.

In other words, when a fiber thread having a large diameter is passed through the base layer 32a to secure a large size of the through hole 321 and then the stitching electrode layer 32b having a small diameter is passed through the through hole 321, the stitching electrode layer 32b loosely fits into the base layer 32a as shown in a magnified portion of FIG. 16.

According to another embodiment of the present disclosure, the through holes may be previously formed in the base layer 32a via punching, before the stitching electrode layer 32b is passed through the base layer 32a. According to this embodiment, a through hole having a desired size may be formed.

Figure 17:
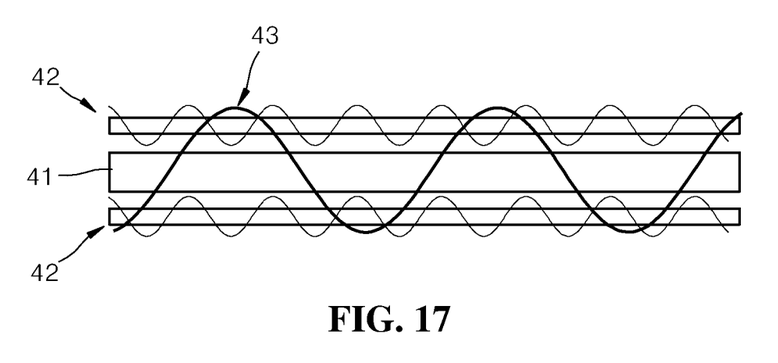
FIG. 17 is a cross-sectional view of an electrode unit for deformation according to another embodiment of the present disclosure.

FIG. 17 is a cross-sectional view of an electrode unit for deformation according to another embodiment of the present disclosure.

The embodiment of FIG. 17 includes a stitching member 43 for bonding that passes between an electricity generator 41 and an electrode part 42, thereby enabling relative deformation between the electricity generator 41 and the electrode part 42 and also bonding the electricity generator 41 and the electrode part 42 with each other without being separated from each other.

In the present embodiment having this configuration, the electricity generator 41 and the electrode part 42 are bonded with each other without being separated from each other by the stitching member 43, and thus electrical connection may be smoothly maintained even during relative deformation between the electricity generator 41 and the electrode part 42.

According to another embodiment of the present disclosure, although not shown in the drawings, not only an electrode part formed of the fiber material but also a fiber-type capacitor may be stitched with each other. According to necessity, the electrode part and the fiber-type capacitor may be realized as a multi-layered layer.

Figure 18:
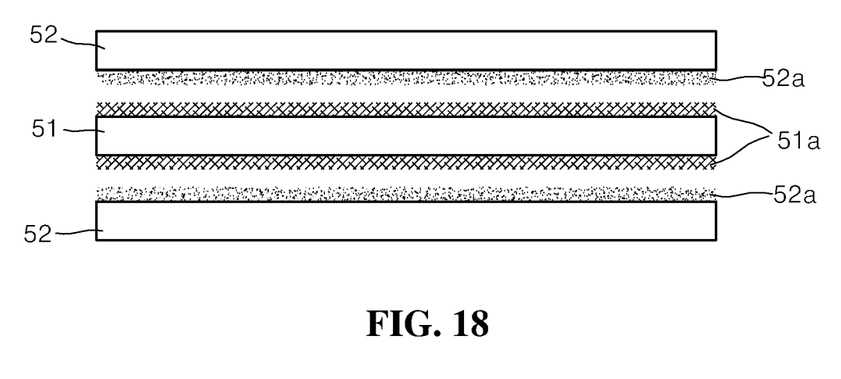
FIG. 18 is a cross-sectional view of an electrode unit for deformation according to another embodiment of the present disclosure.

FIG. 18 is a cross-sectional view of an electrode unit for deformation according to another embodiment of the present disclosure.

The embodiment of FIG. 18 includes Velcro® parts 51a and 52a formed on facing surfaces between an electricity generator 51 and an electrode part 52, thereby allowing relative deformation between the electricity generator 51 and the electrode part 52 and also securing a bonding force without separation from each other.

In the present embodiment having this configuration, similar to the embodiment of FIG. 17, electrical connection may be smoothly maintained even during relative deformation between the electricity generator 51 and the electrode part 52, and, because gradual deformation is achieved with a time interval from deformation to restoration of the electricity generator 51 while Velcro® parts 51a and 52a facing each other are being coupled to each other and then separated from each other, energy may be more continuously harvested due to the gradual deformation of the electricity generator 51.

Although various embodiments of the present disclosure have been described above, the present embodiments and the drawings attached to the present specification merely show a part of the technical spirit included in the present disclosure. It will be apparent that modifications and specific embodiments that can be easily inferred by those skilled in the art within the scope of the technical idea are included in the scope of the present disclosure.

The invention claimed is:

1. An energy harvesting apparatus using an electroactive material, the energy harvesting apparatus comprising:
   an electricity generator including the electroactive material to generate a voltage due to deformation by an external stimulus; and an impact generator including a deformable and restorable material capable of repetitive deformation and restoration and configured to generate in the electricity generator a dynamic behavior based on the repetitive deformation and restoration, wherein a stimulus by the impact generator to the electricity generator enables energy harvest, wherein the impact generator comprises a plurality of deformation parts arranged to correspond to an entire area of the electricity generator so that a multi-point stimulus is enabled in the electricity generator, the deformation parts including the deformable and restorable material wherein the impact generator has a snap dome structure including the deformation parts that are turned over when a threshold load or more is applied thereto, and a connection part configured to connect the deformation parts adjacent to each other, and wherein locking holes are formed in one of connection parts that connect the adjacent deformation parts to each other, and locking pins are formed in the other, so that the adjacent deformation parts are connected to each other through locking between the locking holes and the locking pins.

2. The energy harvesting apparatus of claim 1, wherein each of the deformation parts includes a shape memory material such that the repetitive deformation and restoration are smoothly achieved.

3. The energy harvesting apparatus of claim 1, wherein the impact generator comprises a frame part having a lattice-shaped frame structure to form a plurality of partitioned spaces, and a deformation part located in each of the spaces of the frame part and including the shape memory material.

4. The energy harvesting apparatus of claim 3, wherein a surface of the frame unit that defines each of the spaces of the frame part includes a groove-shaped slot into which an edge of the deformation part fits.

5. The energy harvesting apparatus of claim 1, wherein the impact generator comprises a plurality of deformation parts capable of repetitive deformation and restoration, and each of the deformation parts has a shape corresponding to external surfaces of a pair of molding rollers on a metal thin film by passing the metal thin plate between the pair of molding rollers.

6. An energy harvesting apparatus using an electroactive material, the energy harvesting apparatus comprising:

an electricity generator including the electroactive material to generate a voltage due to deformation by an external stimulus; and an impact generator including a deformable and restorable material capable of repetitive deformation and restoration and configured to generate in the electricity generator a dynamic behavior based on the repetitive deformation and restoration, wherein a stimulus by the impact generator to the electricity generator enables energy harvest, wherein the electricity generator comprises:

a first film layer located to face the impact generator, including the electroactive material, and manufactured in a film form; and a second film layer located on a side of the impact generator opposite to the first film layer, including the electroactive material, and manufactured in a film form, wherein the impact generator comprises unit impact units arranged in a lengthwise direction of the electricity generator so that a multi-point stimulus is enabled in the electricity generator, and each of the unit impact units comprises a deformation part capable of repetitive deformation and restoration, and a sliding part that causes friction with the second film layer by sliding according to deformation of the deformation part.

7. An energy harvesting apparatus using an electroactive material, the energy harvesting apparatus comprising:

an electricity generator including the electroactive material to generate a voltage due to deformation by an external stimulus;

an impact generator including a deformable and restorable material capable of repetitive deformation and restoration and configured to generate in the electricity generator a dynamic behavior based on the repetitive deformation and restoration; and Velcro® parts provided on facing surfaces between the electricity generator and the impact generator, wherein a stimulus by the impact generator to the electricity generator enables energy harvest, wherein the electricity generator comprises a plurality of uneven parts where spreading in a flat form and bending in a curved form are possible.

8. An electrode unit for deformation comprising:

an electricity generator including an electroactive material to generate a voltage due to deformation by an external stimulus; and an electrode part electrically connected to at least one surface of the electricity generator, and including an elastically deformable material to achieve relative deformation while in contact with the electricity generator, wherein the electrode part comprises:

a base layer formed of an elastically deformable material; and a stitching electrode layer formed by penetrating through a surface facing the base layer and a surface located on the opposite side at regular intervals.

9. The electrode unit for deformation of claim 8, wherein the electrode part is formed of a fiber material.

10. The electrode unit for deformation of claim 8, wherein the base layer is formed of the same material as the electricity generator.

11. The electrode unit for deformation of claim 8, wherein the stitching electrode layer is of a fiber thread type, and the base layer includes a plurality of through holes through which the stitching electrode layer of the fiber thread type loosely passes.

12. The electrode unit for deformation of claim 11, wherein each of the through holes is formed by a fiber thread portion having a relatively large diameter passing through the base layer before the stitching electrode layer having a relatively small diameter passes through the base layer.

13. The electrode unit for deformation of claim 11, wherein the through holes are previously formed in the base layer via punching before the stitching electrode layer passes through the base layer.

14. An electrode unit for deformation comprising:

an electricity generator including an electroactive material to generate a voltage due to deformation by an external stimulus;

an electrode part electrically connected to at least one surface of the electricity generator, and including an elastically deformable material to achieve relative deformation while in contact with the electricity generator; and a stitching member for bonding that passes between the electricity generator and the electrode part to bond the electricity generator to the electrode part so as to be able to allow relative deformation between the electricity generator and the electrode part.

15. An electrode unit for deformation comprising:

an electricity generator including an electroactive material to generate a voltage due to deformation by an external stimulus; and an electrode part electrically connected to at least one surface of the electricity generator, and including an elastically deformable material to achieve relative deformation while in contact with the electricity generator, wherein Velcro® parts formed of an electrically conductive material are provided on facing surfaces between the electricity generator and the electrode part so as to provide a bonding force while allowing relative deformation between the electricity generator and the electrode part.

\* \* \* \* \*